(12) United States Patent
Chen et al.

(10) Patent No.: US 10,085,546 B2
(45) Date of Patent: Oct. 2, 2018

(54) HANDS-FREE ELECTRONIC DEVICE

(71) Applicant: Wistron NeWeb Corp., Hsinchu (TW)

(72) Inventors: Ting-Hsuan Chen, Hsinchu (TW);
Jen-Yung Chang, Hsinchu (TW);
Guo-Cheng Tsai, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 0 days.

(21) Appl. No.: 15/706,552

(22) Filed: Sep. 15, 2017

(65) Prior Publication Data
US 2018/0235353 A1 Aug. 23, 2018

(30) Foreign Application Priority Data

Feb. 22, 2017 (TW) .............................. 106105865 A

(51) Int. Cl.
| | | |
|---|---|---|
| *A45F 5/00* | (2006.01) | |
| *A45F 5/02* | (2006.01) | |
| *H05K 5/02* | (2006.01) | |
| *H05K 5/00* | (2006.01) | |

(52) U.S. Cl.
CPC .............. *A45F 5/02* (2013.01); *H05K 5/0086* (2013.01); *H05K 5/0204* (2013.01); *A45F 2200/0525* (2013.01)

(58) Field of Classification Search
CPC ............... A45F 5/02; A45F 2200/0525; H05K 15/0086; H05K 15/0204
USPC ........................................................ 224/312
See application file for complete search history.

(56) References Cited

U.S. PATENT DOCUMENTS

| | | | | |
|---|---|---|---|---|
| 5,799,652 A | * | 9/1998 | Kotliar | A61G 10/00 128/200.24 |
| 5,799,852 A | * | 9/1998 | Vardanega | A45F 5/02 224/667 |
| 7,151,664 B2 | * | 12/2006 | Hosey | G06K 19/077 361/679.4 |
| 7,166,791 B2 | * | 1/2007 | Robbin | G10H 1/0008 84/477 R |
| 7,312,785 B2 | * | 12/2007 | Tsuk | G06F 1/1626 345/156 |
| 7,345,671 B2 | * | 3/2008 | Robbin | G06F 1/1626 178/18.01 |
| 7,348,967 B2 | * | 3/2008 | Zadesky | G06F 1/1626 345/156 |
| D578,139 S | * | 10/2008 | Sheba | D14/496 |
| 8,374,661 B2 | * | 2/2013 | Fratti | A45F 5/02 224/462 |
| 8,948,824 B2 | | 2/2015 | Filson et al. | |

(Continued)

*Primary Examiner* — Peter Helvey

(57) ABSTRACT

A hands-free electronic device is provided, including a housing, a first elastic element and a second elastic element. The housing includes a first side and a second side opposite thereto. The first elastic element includes a first section, a second section and a third section. The first section covers the first side. The second section is connected to the first section, and the second section includes a first concave surface. An end of the third section is connected to the second section, and the other end of the third section is a free end. The second elastic element is disposed in the holding space, wherein a first end of the second elastic element is affixed to the second side, and a second end of the second elastic element is connected to the first elastic element.

20 Claims, 7 Drawing Sheets

(56) References Cited

U.S. PATENT DOCUMENTS

| | | | | |
|---|---|---|---|---|
| 2004/0155079 | A1* | 8/2004 | Shetler | A45F 5/02 |
| | | | | 224/197 |
| 2007/0241149 | A1* | 10/2007 | Bhavnani | G04B 37/1413 |
| | | | | 224/197 |
| 2009/0257207 | A1* | 10/2009 | Wang | G06F 1/1626 |
| | | | | 361/752 |
| 2010/0087232 | A1* | 4/2010 | Yeh | H04M 1/0237 |
| | | | | 455/575.4 |
| 2010/0144408 | A1* | 6/2010 | Chuang | H04M 1/022 |
| | | | | 455/575.4 |

* cited by examiner

HANDS-FREE ELECTRONIC DEVICE

CROSS REFERENCE TO RELATED APPLICATIONS

This Application claims priority of Taiwan Patent Application No. 106105865, filed on Feb. 22, 2017, the entirety of which is incorporated by reference herein.

BACKGROUND OF THE INVENTION

Field of the Invention

The present invention relates to a hands-free electronic device, and in particular to a hands-free electronic device which is fastened by clamping.

Description of the Related Art

Conventional hands-free electronic devices, such as Bluetooth hands-free electronic devices, include a housing, an elastic clip, and a display cover plate. The elastic clip is partially affixed between the display cover plate and the housing, and is attached to a first side of the housing. The hands-free electronic device is affixed to sun visors by the elastic clip. The sun visors have different thickness. The conventional elastic clip is suitable for thick sun visors. However, when the elastic clip clamps to thin sun visors, the elastic clip cannot provide sufficient clamping force, and the hands-free electronic device can easily become separated from the sun visor. Additionally, the elastic clip is partially sandwiched between the display cover plate and the housing. When the elastic clip clamps the sun visor, a gap is formed between the elastic clip and the first side, and the appearance of the hands-free electronic device suffers. Additionally, the conventional display cover plate bears increased torque, and can easily become damaged.

BRIEF SUMMARY OF THE INVENTION

In one embodiment, a hands-free electronic device is provided. The hands-free electronic device includes a housing, a first elastic element and a second elastic element. The housing includes a first side and a second side, and the first side is opposite to the second side. The first elastic element includes a first section, a second section and a third section. The first section covers the first side. The second section is curved, the second section is connected to the first section, and the second section includes a first concave surface. An end of the third section is connected to the second section, and the other end of the third section is a free end, wherein the first section, the second section and the third section compose a curved structure, the curved structure surrounds the housing and defines a holding space, and the first concave surface faces the holding space. The second elastic element is disposed in the holding space, wherein a first end of the second elastic element is affixed to the second side, a second end of the second elastic element is connected to the first elastic element, the second elastic element includes a second concave surface, and the second concave surface faces the holding space.

Utilizing the hands-free electronic device of the embodiment of the invention, the second elastic element provides an additional clamping function. Therefore, the hands-free electronic device can sufficiently clamp to objects (for example, a sun visor) of different thicknesses.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
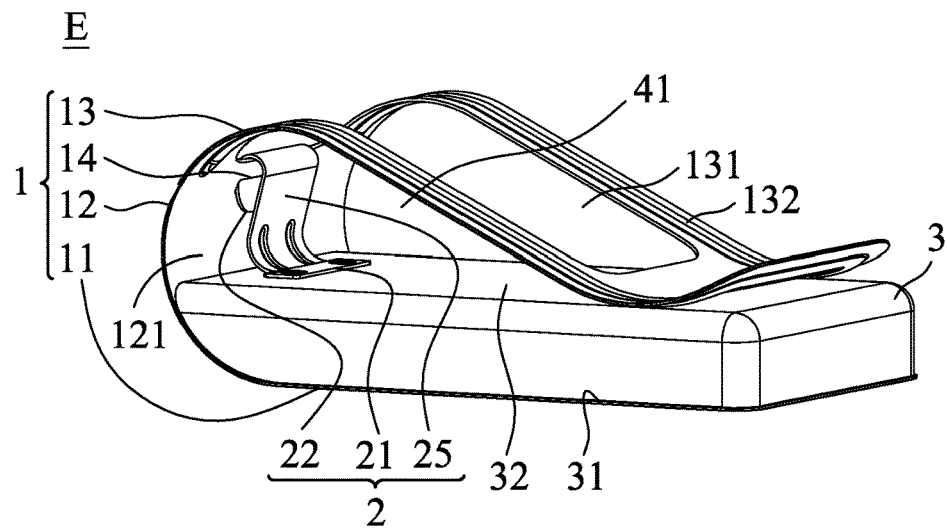
FIG. 1A is a perspective view of a hands-free electronic device of an embodiment of the invention.
Figure 1B:
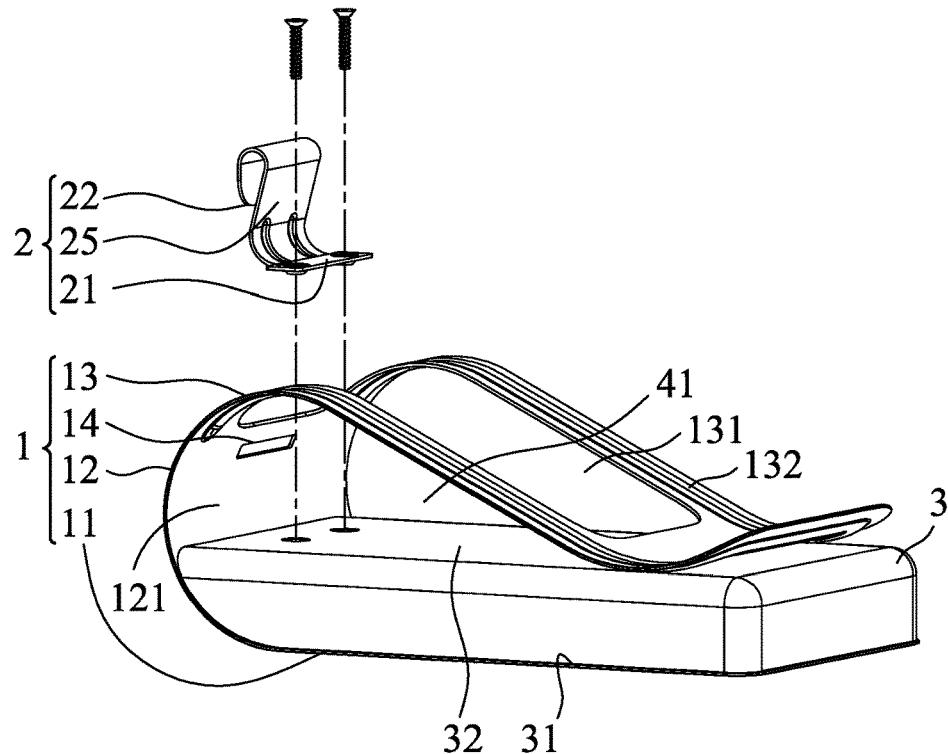
FIG. 1B is an exploded view of a portion of the hands-free electronic device of the embodiment of the invention.
Figure 2A:
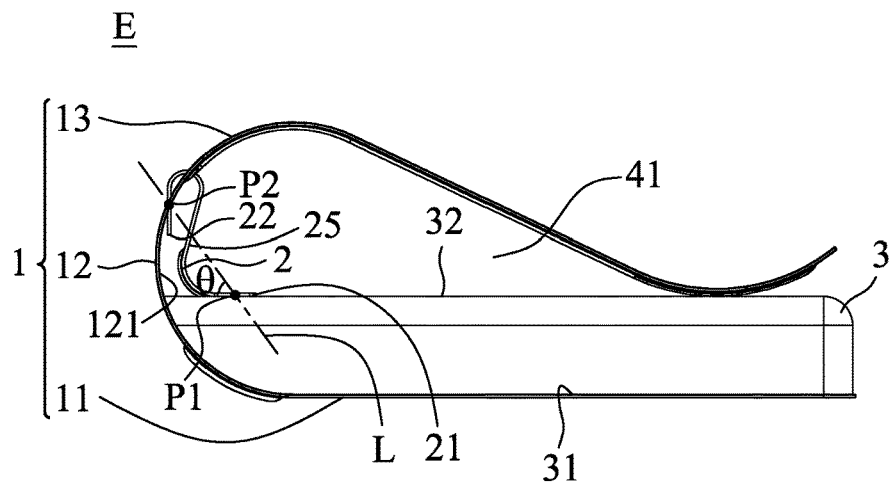
FIG. 2A is a side view of the hands-free electronic device of the embodiment of the invention, wherein the hands-free electronic device is in a non-clamping state.
Figure 2B:
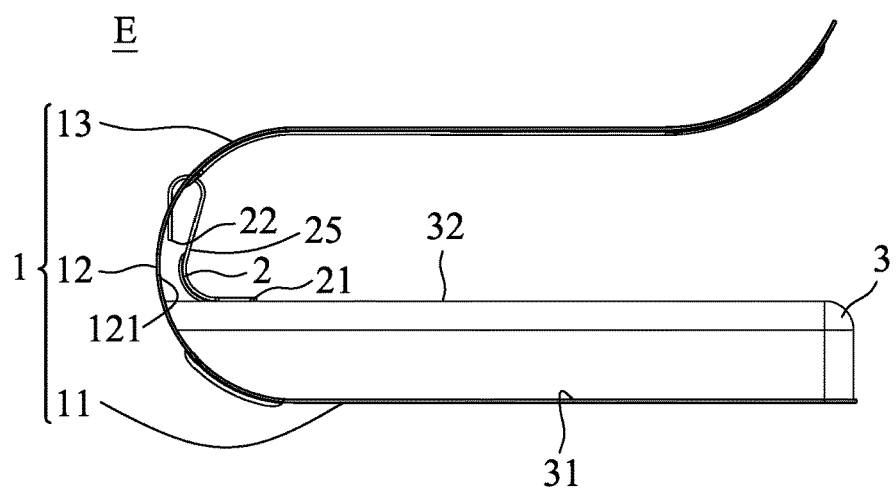
FIG. 2B is a side view of the hands-free electronic device of the embodiment of the invention, wherein the hands-free electronic device is in a clamping state.

FIG. 1A is a perspective view of a hands-free electronic device E of an embodiment of the invention. FIG. 1B is an exploded view of a portion of the hands-free electronic device E of the embodiment of the invention. FIG. 2A is a side view of the hands-free electronic device E of the embodiment of the invention, wherein the hands-free electronic device E is in a non-clamping state. FIG. 2B is a side view of the hands-free electronic device E of the embodiment of the invention, wherein the hands-free electronic device E is in a clamping state. With reference to FIGS. 1A, 1B, 2A and 2B, the hands-free electronic device E of the embodiment of the invention includes a housing 3, a first elastic element 1 and a second elastic element 2. The housing 3 includes a first side 31 and a second side 32. The first side 31 is opposite to the second side 32. The first elastic element 1 includes a first section 11, a second section 12 and a third section 13. The first section 11 covers the first side 31. The second section 12 is curved. The second section 12 is connected to the first section 11, and the second section 12 includes a first concave surface 121. An end of the third section 13 is connected to the second section 12, and the other end of the third section 13 is a free end. The first section 11, the second section 12 and the third section 13 compose a curved structure. The curved structure surrounds the housing 3 and defines a holding space 14. The first concave surface 121 faces the holding space 41. The curved structure can be a U-shaped structure. The second elastic element 2 is disposed in the holding space 41. A first end 21 of the second elastic element 2 is affixed to the second side 32. A second end 22 of the second elastic element 2 is connected to the first elastic element 1. The second elastic element 2 includes a second concave surface 25, and the second concave surface 25 faces the holding space 41. In one embodiment, the radius of curvature of the first concave surface 121 and the radius of curvature of the second concave surface 25 can be in different values but with the same sign, for instance, both radius of curvatures of the first concave surface 121 and the second concave surface 25 are all positive values. The values may also be negative in other embodiments, and the values may also be the same as well, as long as the concave surfaces 121 and 25 face toward the same side. In particular, the first concave surface 121 and the second concave surface 25 face the object to be clamped to (for example, a sun visor).

Utilizing the hands-free electronic device of the embodiment of the invention, the second elastic element provides an additional clamping function. Therefore, the hands-free electronic device can sufficiently clamp to objects (for example, a sun visor) of different thicknesses. With reference to FIGS. 2A and 2B, the third section 13, a portion of the second section 12, the second elastic element 2 and the second side 32 compose a U-shaped clamping structure (stress transmission path) with a reduced radius of curvature. The clamping ability of the hands-free electronic device is thus improved.

With reference to FIGS. 1A and 1B, in one embodiment, the second elastic element 2 is S-shaped, the first elastic element 1 has a connection slot 14, and the second end 22 of the second elastic element 2 is inserted into the connection slot 14 and abuts the first elastic element 1. In this embodiment, the connection slot 14 is formed on the second section 12.

With reference to FIGS. 1A and 1B, in this embodiment, the third section 13 has an opening 131. The second elastic element 2 passes through the opening 131 from the holding space 41, and then passes through the connection slot 14 to be inserted into the holding space 41. Therefore, the second elastic element 2 is connected to the first elastic element 1. In one embodiment, the opening 131 can extend from the third section 13 to the second section 12. The disclosure is not meant to restrict the invention.

In one embodiment, the second end 22 of the second elastic element 2 can be affixed to the first elastic element 1 by a screw or other means. The second elastic element 2 can be C-shaped or another proper shape. The disclosure is not meant to restrict the invention.

With reference to FIGS. 1A and 1B, the third section 13 has at least one first enhancement rib 132, and the first enhancement rib 132 extends from the second section 12 toward the free end. The first enhancement rib 132 increases the strength of the third section 13. In one embodiment, the first enhancement rib 132 can extend from the third section 13 to the second section 12. The disclosure is not meant to restrict the invention.

With reference to FIG. 2A, in one embodiment, the first end 21 of the second elastic element 2 is affixed to a first connection point P1 of the second side 32. The second end 22 abuts a second connection point P2 of the connection slot 14. A reference line L passes through the first connection point P1 and the second connection point P2. In one embodiment, an included angle θ between the reference line L and the second side 32 is between 60 and 90 degrees. Within this range of the included angle θ, the second elastic element 2 sufficiently guides the stress and improves the clamping effect. The range disclosed above is not meant to restrict the invention.

Figure 3A:
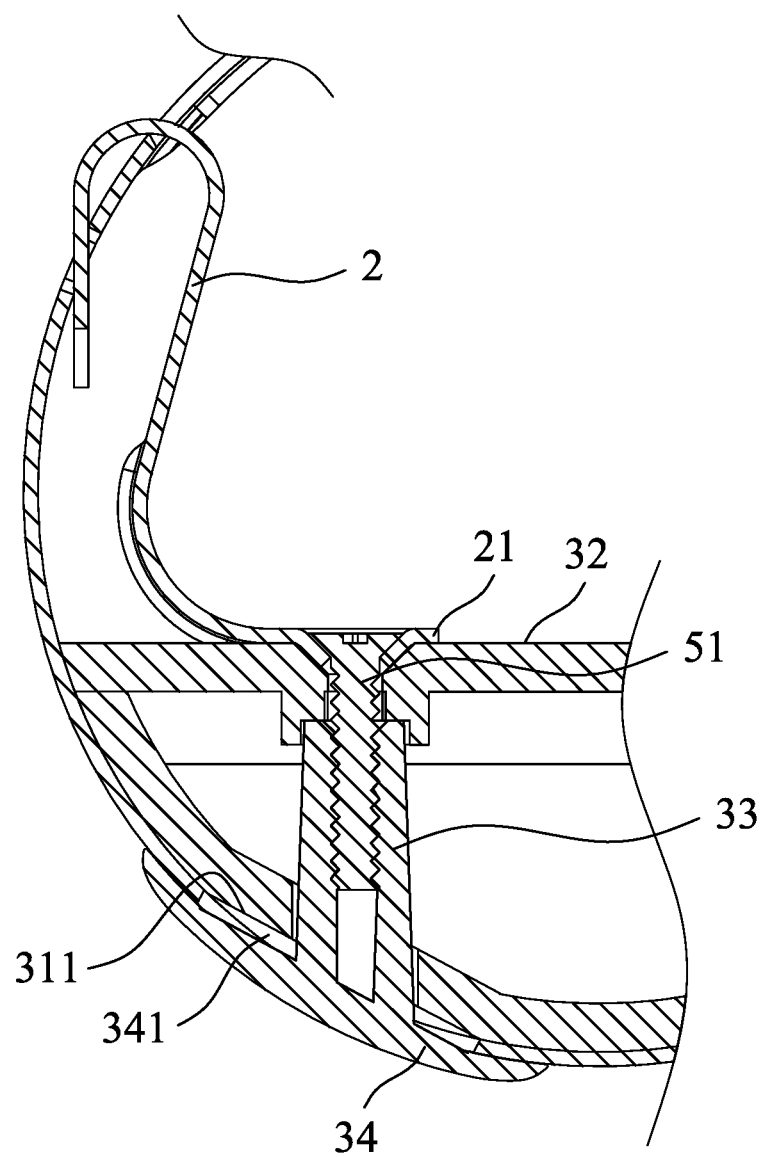
FIG. 3A is a cross sectional view of a fastening element and a fixing base of the embodiment of the invention.
Figure 4A:
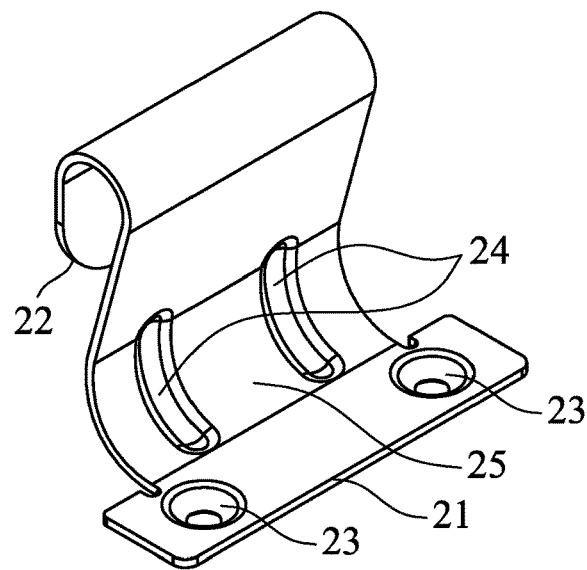
FIG. 4A shows the details of a second elastic element of the embodiment of the invention.
Figure 4B:
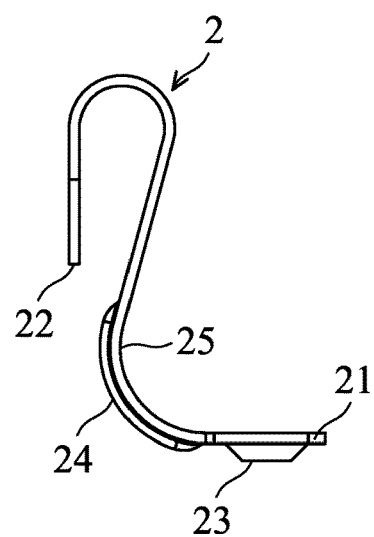
FIG. 4B is a side view of the second elastic element of the embodiment of the invention.

With reference to FIG. 3A, in one embodiment, the hands-free electronic device E further comprises fastening elements 51 and fixing bases 33. In this embodiment, the fastening elements 51 are screws, which can also be other fastening elements such as bolts. The fixing bases 33 are disposed in the housing 3. The fastening elements 51 pass through the first end 21 of the second elastic element 2 and the second side 32 of the housing, and the fastening elements 51 are affixed into the fixing bases 33 to fasten the first end 21 of the second elastic element 2. With reference to FIGS. 4A and 4B, in detail, the second elastic element 2 further comprises through holes 23 and second enhancement ribs 24. The second enhancement ribs 24 extend from the first end 21 to the second end 22. The second enhancement ribs 24 increase the structural strength of the second elastic element 2. The fastening elements 51 pass through the through holes 23, and are affixed into the fixing bases 33. The through holes 23 can be cone-shaped holes. Ideally, the fastening elements 51 can be countersunk head screws in order to prevent scratches of the surface of the object to be clamped to (for example, a sun visor).

Figure 3B:
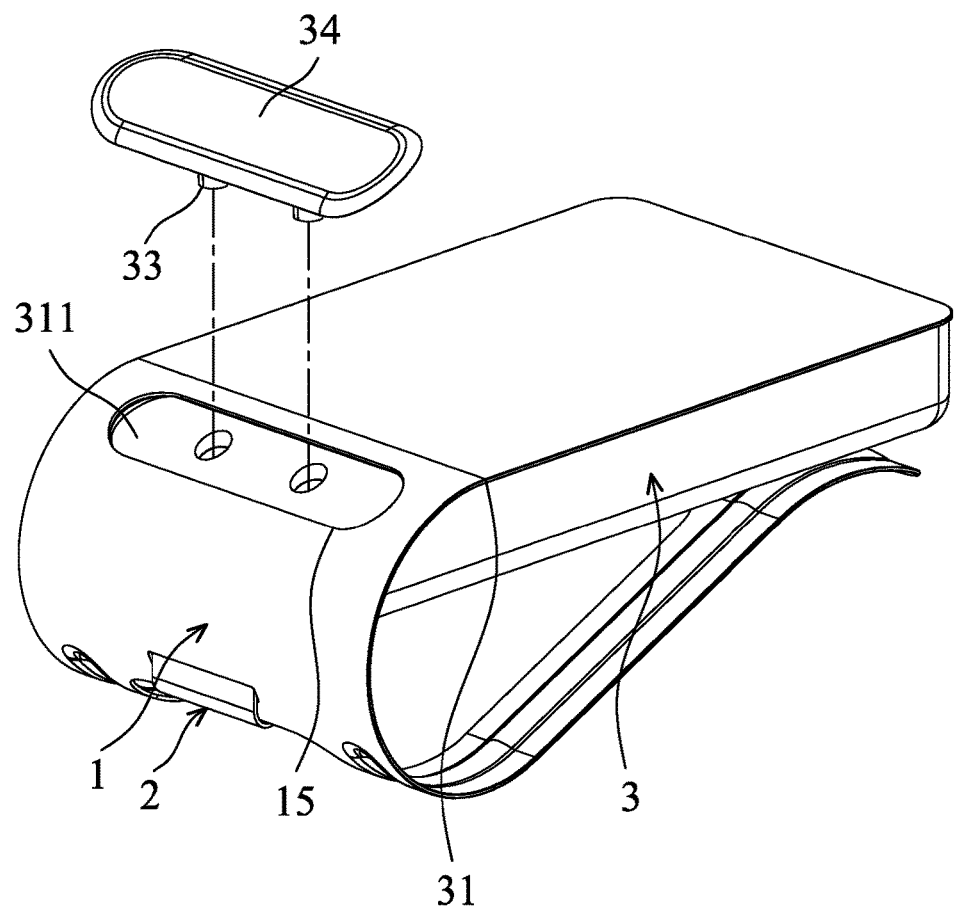
FIG. 3B shows a positioning slot of the embodiment of the invention.
Figure 3C:
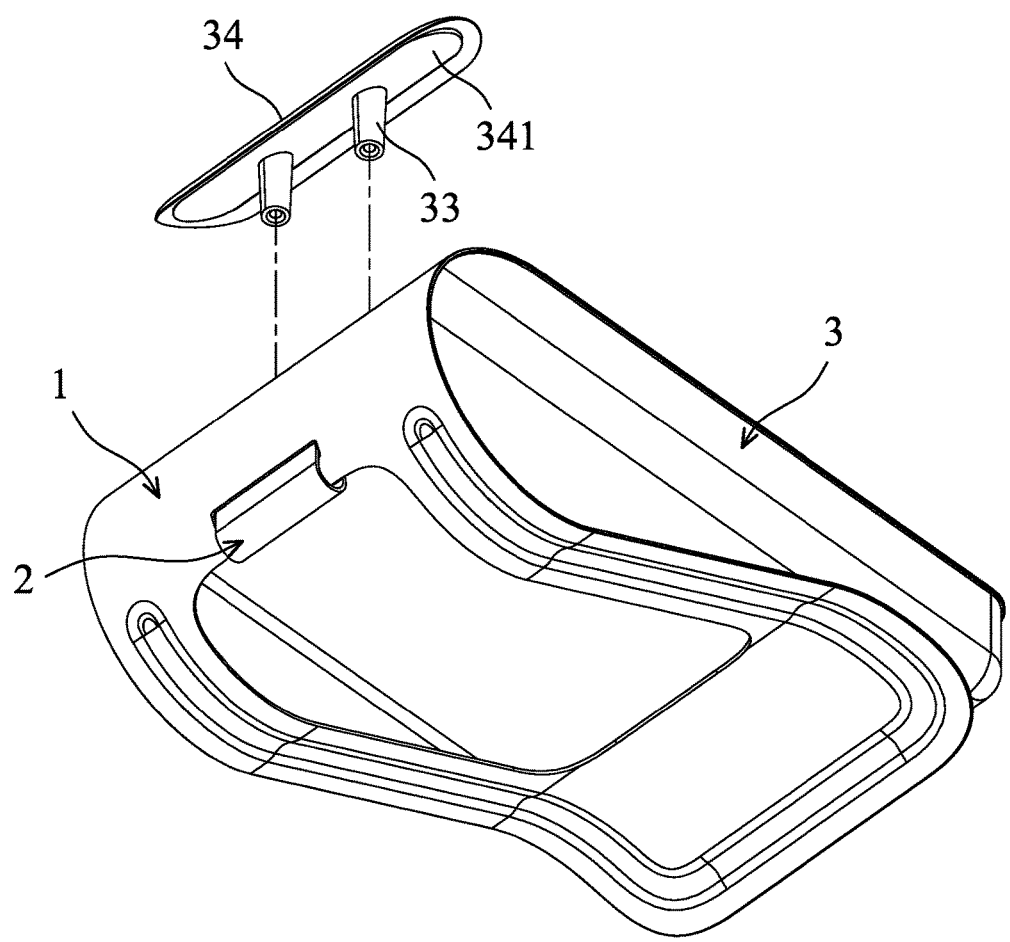
FIG. 3C shows an abutting piece of the embodiment of the invention.

With reference to FIGS. 3A, 3B and 3C, in one embodiment, the hands-free electronic device E further comprises a cover plate 34, the fixing bases 33 are fastened to the cover plate 34, so that a part of the first elastic element 1 is sandwiched between the cover plate 34 and the first side 31. With reference to FIGS. 3B and 3C, in one embodiment, the first side 31 has a contacting surface 311, and the first elastic element 1 further includes a positioning slot 15. The positioning slot 15 corresponds to the contacting surface 311. The cover plate 34 includes an abutting piece 341. The fixing bases 33 are integrally formed on the abutting piece 341 of the cover plate 34, and the abutting piece 341 is fitted in the positioning slot 15 and abuts against the contacting surface 311. The cover plate 34 covers the positioning slot 15. In this embodiment, the fixing bases 33 are integrally formed on the cover plate 34. The cover plate 34 can be the cover plate of a display screen.

Utilizing the hands-free electronic device of the embodiment of the invention, the second elastic element guides the stress which is applied to the cover plate to the second side, and the second elastic element decreases the torque between the fastening point and the force-applied point. The cover plate and the fixing bases are prevented from being damaged. The gap between the first section and the first side is prevented, and the appearance of the hands-free electronic device is improved.

Figure 5A:
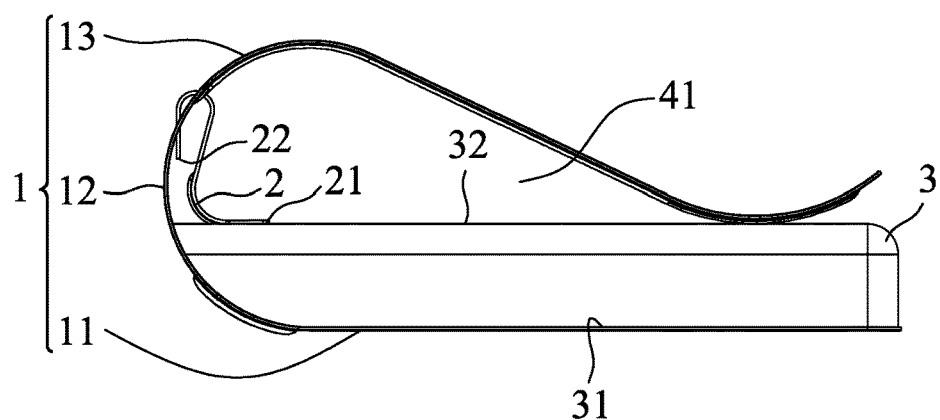
FIG. 5A shows the fastening element of the embodiment of the invention in a first affixing position.
Figure 5B:
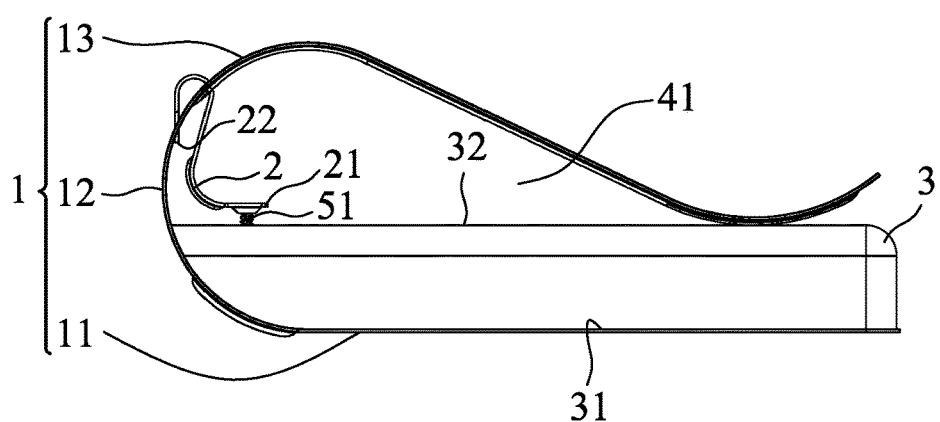
FIG. 5B shows the fastening element of the embodiment of the invention in a second affixing position.

With reference to FIGS. 5A and 5B, in one embodiment, the fastening element 51 can be selectively adjusted (screwed) between a first affixing position (FIG. 5A) and a second affixing position (FIG. 5B). When the fastening element 51 is in the first affixing position, the first elastic element 1 has a first holding force. When the fastening element 51 is in the second affixing position, the first elastic element 1 has a second holding force. The first holding force is greater than the second holding force. The fastening element 51 being in the first affixing position is closer to the housing than being in the second affixing position. In this embodiment, when the fastening element 51 is in the first affixing position, the second elastic element 2 applies a first force on the second elastic element 1. When the fastening element 51 is in the second affixing position, the second elastic element 2 applies a second force on the second elastic element 1. The first force is greater than the second force. In other words, utilizing the hands-free electronic device of the embodiment of the invention, the clamping force applied to the object to be clamped to by the first elastic element can be adjusted.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A hands-free electronic device, comprising:
   a housing, having a first side and a second side opposite to the first side;
   a first elastic element, comprising:
     a first section, covering the first side;
     a second section, wherein the second section is curved, the second section is connected to the first section, and the second section comprises a first concave surface; and
     a third section, wherein an end of the third section is connected to the second section, and the other end of the third section is a free end, wherein the first section, the second section and the third section compose a curved structure, the curved structure surrounds the housing and defines a holding space with the housing, and the first concave surface faces the holding space; and
   a second elastic element, disposed in the holding space, wherein a first end of the second elastic element is affixed to the second side of the housing, a second end of the second elastic element is connected to the first elastic element, and the second elastic element comprises a second concave surface facing the holding space.

2. The hands-free electronic device as claimed in claim 1, wherein the second elastic element is S-shaped, the first elastic element has a connection slot, and the second end of the second elastic element is inserted into the connection slot and abuts against an edge of the connection slot.

3. The hands-free electronic device as claimed in claim 2, wherein the connection slot is formed on the second section.

4. The hands-free electronic device as claimed in claim 3, wherein the curved structure has an opening, and the second elastic element passes through the opening from the holding space, and then passes through the connection slot to be inserted into the holding space.

5. The hands-free electronic device as claimed in claim 1, wherein the curved structure comprises at least one first enhancement rib, and the first enhancement rib extends from the second section or the third section toward the free end.

6. The hands-free electronic device as claimed in claim 1, wherein the first end of the second elastic element is affixed to a first connection point of the second side, and the second end abuts against a second connection point on an edge of the connection slot, wherein the included angle between a reference line connecting the first connection point and the second connection point, and the second side is between 60 and 90 degrees.

7. The hands-free electronic device as claimed in claim 1, further comprising a fastening element and a fixing base, wherein the fixing base is disposed in the housing, the fastening element passes through the first end of the second elastic element and the second side of the housing, and the fastening element is affixed into the fixing base to fasten the first end of the second elastic element.

8. The hands-free electronic device as claimed in claim 7, wherein when the fastening element is in a first affixing position, the first elastic element has a first holding force, and when the fastening element is in a second affixing position, the first elastic element has a second holding force, and the first holding force is greater than the second holding force, wherein the fastening element being in the first affixing position is closer to the housing than being in the second affixing position.

9. The hands-free electronic device as claimed in claim 7, further comprising a cover plate, the fixing base is connected with the cover plate, and a part of the first elastic element is sandwiched between the cover plate and the first side.

10. The hands-free electronic device as claimed in claim 9, wherein the first elastic element further comprises a positioning slot, the fixing base is integrally formed on the cover plate, the fixing base passes through the positioning slot, and the cover plate covers the positioning slot.

11. The hands-free electronic device as claimed in claim 10, wherein the first side has a contacting surface, the positioning slot corresponds to the contacting surface, the cover plate includes an abutting piece, the fixing base is integrally formed on the abutting piece of the cover plate, and the abutting piece is fitted in the positioning slot and abuts against the contacting surface.

12. The hands-free electronic device as claimed in claim 1, wherein the second elastic element further comprises at least one second enhancement rib, and the second enhancement rib extends between the first end and the second end.

13. A hands-free electronic device, comprising:
   a housing, having a first side and a second side opposite to the first side;
   a first elastic element, comprising:
     a first section, covering the first side;
     a second section, wherein the second section is curved, the second section is connected to the first section, and the second section comprises a first concave surface; and
     a third section, wherein an end of the third section is connected to the second section, and the other end of the third section is a free end, wherein the first section, the second section and the third section compose a curved structure, the curved structure surrounds the housing and defines a holding space with the housing, and the first concave surface faces the holding space;
   a second elastic element, disposed in the holding space, wherein a first end of the second elastic element is affixed to the second side of the housing, and a second end of the second elastic element is connected to the first elastic element;
   a fastening element; and
   a fixing base, wherein the fixing base is disposed in the housing, the fastening element passes through the first end of the second elastic element and the second side of the housing, and the fastening element is affixed into the fixing base to fasten the first end of the second elastic element, wherein when the fastening element is in a first affixing position, the first elastic element has a first holding force, and when the fastening element is in a second affixing position, the first elastic element has a second holding force, the first holding force is greater than the second holding force, wherein the fastening element being in the first affixing position is closer to the housing than being in the second affixing position.

14. The hands-free electronic device as claimed in claim 13, wherein the second elastic element is S-shaped, the first elastic element has a connection slot, and the second end of the second elastic element is inserted into the connection slot and abuts against an edge of the connection slot.

15. The hands-free electronic device as claimed in claim 14, wherein the connection slot is formed on the second section.

16. The hands-free electronic device as claimed in claim 15, wherein the curved structure has an opening, and the second elastic element passes through the opening from the holding space, and then passes through the connection slot to be inserted into the holding space.

17. The hands-free electronic device as claimed in claim 13, wherein the curved structure comprises at least one first enhancement rib, and the first enhancement rib extends from the second section or the third section toward the free end.

18. The hands-free electronic device as claimed in claim 13, wherein the first end of the second elastic element is affixed to a first connection point of the second side, and the second end abuts against a second connection point on an edge of the connection slot, wherein the included angle between a reference line connecting the first connection point and the second connection point, and the second side is between 60 and 90 degrees.

19. The hands-free electronic device as claimed in claim 13, further comprising a cover plate, the fixing base is connected with the cover plate, and a part of the first elastic element is sandwiched between the cover plate and the first side.

20. The hands-free electronic device as claimed in claim 19, wherein the first elastic element further comprises a positioning slot, the fixing base is integrally formed on the cover plate, the fixing base passes through the positioning slot, and the cover plate covers the positioning slot.

* * * * *